United States Patent [19]
Holecek

[11] 3,934,206
[45] Jan. 20, 1976

[54] RECEIVER WITH ADJUSTABLE SQUELCH

[75] Inventor: C. Lloyd Holecek, Marion, Iowa

[73] Assignee: Rockwell International Corporation, El Segundo, Calif.

[22] Filed: Sept. 26, 1974

[21] Appl. No.: 509,519

[52] U.S. Cl. .............................................. 325/478
[51] Int. Cl.² ........................................... H04B 1/10
[58] Field of Search .......... 325/478, 402, 348, 456, 325/319, 313, 314, 390, 309, 310, 389, 473

[56] References Cited
UNITED STATES PATENTS

| | | | |
|---|---|---|---|
| 3,323,066 | 5/1967 | Kurtz | 325/478 X |
| 3,374,437 | 3/1968 | Heald | 325/402 |

Primary Examiner—Robert L. Griffin
Assistant Examiner—Robert Hearn
Attorney, Agent, or Firm—Terry M. Blackwood; Robert J. Crawford

[57] ABSTRACT

A radio receiver having adjustable squelch means and including demodulator means, intelligence processing means including gating means, and squelch circuit means for controlling the gating means. The squelch circuit includes voltage dividing means which controls the amplitude of a squelch drive signal and/or a reference signal. Squelch control adjustment means provides variable resistance paths around each of the divider network resistive elements.

13 Claims, 1 Drawing Figure

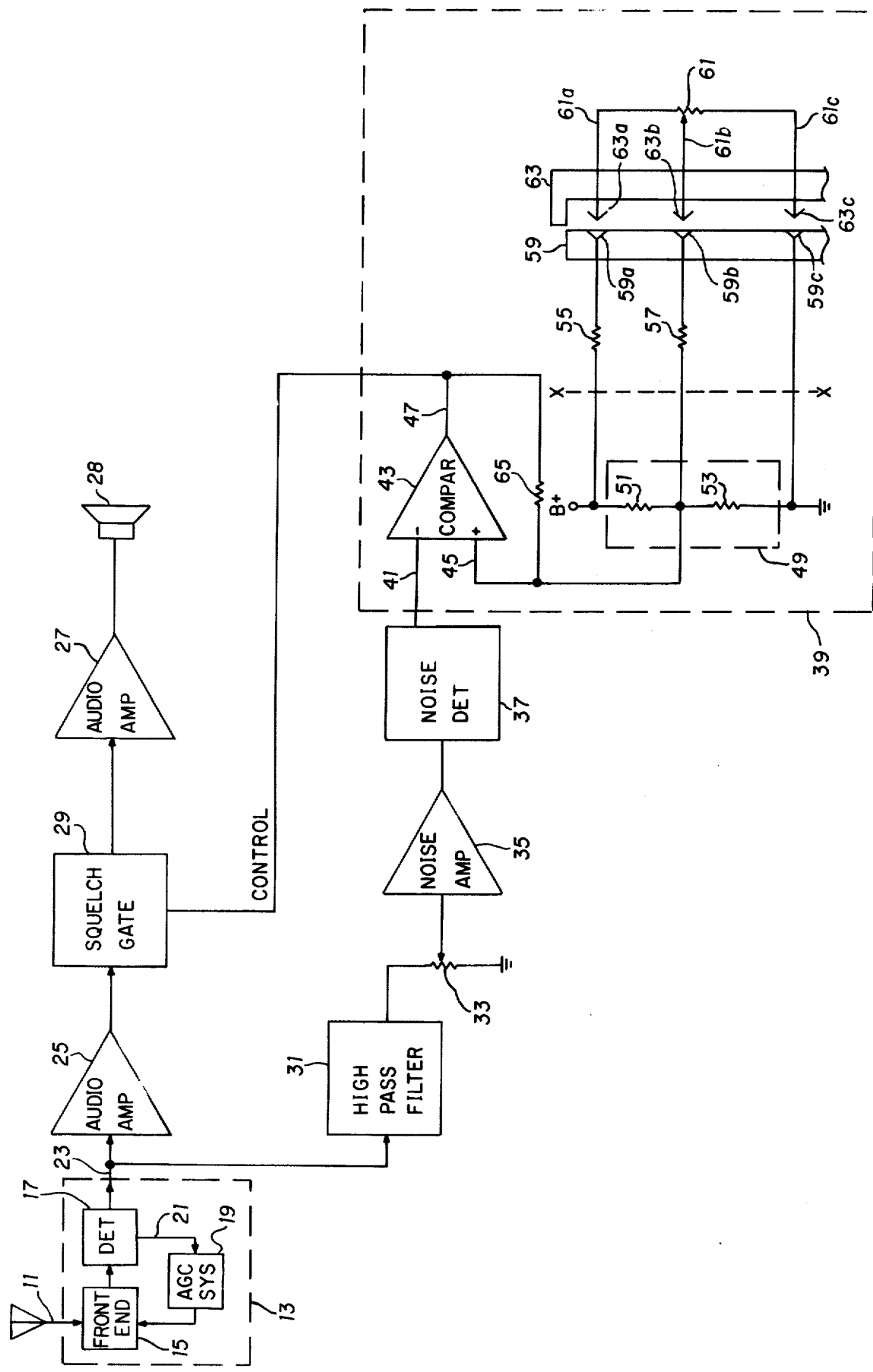

RECEIVER WITH ADJUSTABLE SQUELCH

BACKGROUND OF THE INVENTION

The present invention is related to receiver quieting and in particular to receivers having adjustable squelch control.

Squelch systems are commonly employed in VHF and UHF receivers to suppress noise when little or no signal is being received. More particularly, intelligence processing circuits, typically audio circuits, are turned on or off in accordance with excursions of a squelch drive signal across a threshold level. Generally, in order to change the threshold level, an adjustment internal to the receiver is required. The receiving equipment is generally remote and manual adjustment can be made only periodically.

Sometimes, however, users require provisions for an optional external squelch level control to permit the crew to adjust the squelch setting. Prior art approaches to providing such external control many times introduce one or more undesirable characteristics (see ARINC CHARACTERISTIC 566 by Aeronautical Radio, Inc., issued Oct. 17, 1968, Section 3.12.1). For instance, some receivers with adjustable squelch control are not interchangeable with receivers having only a preset squelch threshold. This is undesirable from both the manufacturers' and users' standpoint because it prevents standardization. Even interchangeale systems may require needless duplication of components, an expensive control system and/or unnecessarily complex interconnection and/or readjustment of internal squelch threshold. Both interchangeable and noninterchangeable systems sometimes provide external squelch adjustment only in one direction; i.e., either above or below the preset threshold. It can also happen that the adjustment is permanent in the sense that even after the extenal adjustment control is removed, the internal setting is no longer positioned for the preset level.

Thus it is an object of this invention to provide an improved receiver with an adjustable squelch control which overcomes the aforementioned difficulties.

These and other objects, features and advantages of the invention will become more apparent upon reference to the following specification, claims and appended drawing in which the single FIGURE is a combination block diagram and detailed schematic and represents a receiving system including the presently preferred embodiment of this invention.

DETAILED DESCRIPTION OF THE PREFERRED EMBODIMENT

A receiver incorporating the principles of the present invention, and in addition representing the presently preferred embodiment is shown in the figure. Since the embodiment bears many similarities to a receiver described in U.S. Pat. No. 3,188,571 assigned to the assignee of the present invention, the following description will set forth only a brief summary of the well-known and understood receiver portions.

Briefly, then, an incoming signal 11 is fed through signal demodulator means 13 including a receiver front end 15 and a detector 17. An AGC system 19 employs part of detector output signal 21 to derive a feedback signal to control the gain of an amplifier or amplifiers in front end 15. Front end 15 preferably comprises an RF amplifier, a mixer, an oscillator and an IF amplifier. The detector 17 is usually a diode type AM detector. Other choices, appropriate for the type of signal being received, will be apparent to those skilled in the art; what is important is that the demodulator recover the intelligence originally impressed on the RF carrier.

In the preferred embodiment, the recovered intelligence is an audio frequency waveform and the demodulator output 23 is connected to an audio channel containing two audio amplifiers 25 and 27, and a speaker or headset 28. Gating means 29 is also included in the audio channel and preferably comprises a FET analog switch in series with the audio channel which is switched to its "off" mode by the application of a negative control voltage and prevents transmission of the audio to amplifier 27 and speaker 28. Alternatively, the switch may be an integral part of audio amplifier 27 such that the "off" mode is achieved by using a control voltage of appropriate polarity to remove bias current from audio output transistors. Other satisfactory gating circuits will be apparent to those skilled in the art.

Connected between the demodulator output 23 and the squelch gate 29 is a squelch circuit including a high-pass filter 31, a potentiometer 33, a noise amplifier 35, a noise detector 37, and control signal generating means 39.

High-pass filter 31, which may alternatively be a band-pass filter, effectively blocks the desired audio signal but passes noise higher in frequency than the desired audio signal that is provided from demodulator 13 through an amplitude control potentiometer 33 and then on to noise amplifier 35. Amplifier 35 increases the noise voltage out of demodulator 13 to a level sufficient for operating the following noise detector stage 37. Noise detector 37 converts noise passed from noise amplifier 35 to a squelch drive signal useful for operating control signal generating means 39 and thus for controlling gating circuit 29.

The lower cutoff frequency of filter 31 is near the upper 3 db point of the audio pass band and is normally adjusted experimentally to minimize the effects of modulation on the noise detector 37 DC output. The frequency response of the noise amplifier 35 extends from the upper end of the audio range to, normally, at least one-half the IF bandwidth. This ensures that most of the available noise is amplified and modulation components, not blocked by filter 31, are attenuated.

In accordance with the present invention, the squelch drive signal, appearing in the preferred embodiment as noise detector output 41, is compared in comparator 43 with an optionally adjustable reference signal 45, and the comparator output 47, connected to the squelch gate, provides audio channel gating control. More particularly, the noise detector output 41, a DC voltage, is connected to the inverting input of comparator 43 and the comparator output is connected to squelch gate 29. Comparator 43 preferably comprises a high gain DC amplifier with differential inputs having relatively fast transient response characteristics; typically employed is a type 710 voltage comparator or a type 741 operational amplifier used as a comparator both being widely available from many semiconductor manufacturers.

Connected to the noninverting input of comparator 43 is the center tap of voltage divider network 49 comprising series connected resistors 51 and 53. One end of voltage divider network 49 is connected to a B+ voltage and the other end is grounded.

Connected to the high voltage end of resistor 51 is one end of resistor 55; connected to the opposite end of resistor 51 is one end of resistor 57. The opposite ends of resistors 55 and 57 are brought to separate connector pins 59a and 59b and are left open circuited for "normal" operating conditions. (Note — "normal" is used herein to denote conditions when no external reference signal adjustment is desired.) Connector pin 59c is grounded. The ends 61a and 61c of potentiometer 61 are brought to connector pins 63a and 63c, and the potentiometer wiper 61b is brought to connector pin 63b. Following appropriate joining of connectors 59 and 63, one end of potentiometer 61 is connected to the originally free end of resistor 55, the potentiometer wiper 61b is connected to the originally free end of resistor 57, and the other end of potentiometer 61 is grounded.

Also connected to the noninverting input of comparator 43 is one end of resistor 65 whose other end is connected to the comparator output 47.

Preferable values are as follows: resistors 51, 53, 55, 57 and 65 equal respectively in kilohms, 22, 3.9, 27, 1.8, and 39. Potentiometer 61 is a 10 kilohm potentiometer.

In the preferred embodiment, pin type connectors are the preferred apparatus for providing the appropriate connection since potentiometer 61 and the remainder of the receiver are physically remote from one another and since the option to employ potentiometer 61, while always available, may not always be exercised. However other appropriate provisions for connection will be apparent to those skilled in the art. For instance, a three pole, single throw switch, or merely a terminal board.

By using the principle of superposition, the reference signal 45 against which noise detector output is compared in operation, may be considered as comprising two components. For normal operating conditions one component constitutes a predetermined percentage of the B+ voltage contributed via the voltage divider network 49, and the other component constitutes a percentage of comparator output 47 contributed via feedback resistor 65. In effect, the voltage divider network 49 controls the basic amplitude of the reference signal, and feedback resistor 65, when employed, has, as is more detailed hereinbelow, a level modifying effect on the basic amplitude of the reference signal depending on the state of comparator 43.

Also, in the preferred embodiment, a voltage dividing network (e. g. potentiometer 33) is available for controlling the amplitude of the squelch drive signal. By changing this voltage dividing ratio (i.e. the setting of potentiometer 33) the noise detector output, for a given demodulator noise output level, may be changed.

During reception of a strong audio bearing signal, noise detector output 41 is very small, the comparator output is positive, and the squelch gate is permitted to pass the audio signal to speaker 28. While the comparator output is positive, resistor 65 provides feedback which increases the reference signal over what it would be with the divider network 49 voltage contribution alone. As the received RF carrier disappears, the AGC increases the receiver gain and the noise detector output increases. When the noise detector output exceeds the reference signal amplitude, the comparator output becomes negative and controls the squelch gate to a condition preventing transmission of signal through the audio channel. Also while the comparator output is negative, resistor 65 provides feedback which decreases the reference signal with respect to what it would be with the divider network voltage contribution alone. Thus, although the inclusion of feedback resistor 65 is not necessary to practice the present invention, its inclusion is preferred since the contribution of this resistor is to provide a hysteresis effect which assures that the audio channel is quick to turn on and quick to turn off. Additionally, the hysteresis effect requires a lower signal to noise ratio for turn off than for turn on. This prevents nuisance switching when receiving a signal level near the threshold setting.

When the user opts to connect potentiometer 61, a variable resistance electrical path is introduced around each resistor of the voltage divider network 49. The operation of the squelch system as above described remains basically unchanged except that the reference signal amplitude (and thus the squelch threshold) is now operator-adjustable. The B+ voltage is typically +12 volts DC and before connection of potentiometer 61 the reference signal contribution of divider network 49 is typically 1.8 volts. After connection of potentiometer 61 this reference signal contribution is adjustable over a range from roughly 0.63 volts (for potentiometer wiper 61b at ground potential) to 2.2 volts (for potentiometer wiper 61b at high voltage end). Thus adjustment both above and below the basic amplitude of the normal reference signal may be accomplished.

Control signal generating means 39 may also be described as a Schmitt trigger with voltage divider 49 setting up the Schmitt trigger trip level and with resistor 65 providing the Schmitt trigger hysteresis in the normal operating condition with potentiometer 61 disconnected by connectors 59 and 63. When connected, potentiometer 61 is so biased that its output on line 61b "pulls" the Schmitt trigger trip level up or down depending on the setting of potentiometer 61. Resistors 55 and 57 respectively set the maximum voltage limit and the minimum voltage limit to which potentiometer 61 can pull the Schmitt trigger trip level.

Resistors 55 and 57 are not necessary but are highly preferred because their presence permits a vernier adjustment of the reference signal amplitude with potentiometer 61. Were resistors 55 and 57 absent, (i.e., both = 0Ω) the divider network contribution could be adjusted from zero volts to the full amplitude of the B+ voltage. Also with resistor 57 absent (i.e., = 0Ω) and potentiometer wiper 61b adjusted to be at ground potential, feedback contribution would disappear.

It should now be apparent that the present invention overcomes the aforementioned difficulties inherent in many prior art receivers. Interchangeability is accomplished because no changes internal to the receiver are required in changing from a fixed threshold mode to an adjustable threshold mode. Interconnection of the adjustment means is simple, and dummy loads and/or component duplication are not needed. Moreover, adjustment both above and below the internally set preset threshold level is achieved, and upon disconnecting the adjustment means, the squelch threshold automatically returns to its preset level.

It should also be apparent that various modifications, some examples of which are set forth below, may be made to the preferred embodiment without departing from the inventive teachings herein. As already mentioned, resistors 55 and 57 can be omitted if vernier adjustment is not desired. Also, resistor 65 can be omitted if its hysteresis providing effect is not desired. For some applications, it may also be desirable to permanently connect resistors 55 and 57 to the appropriate leads of potentiometer 61 and move connectors 59 and 63 to the location indicated in the figure by line X—X. Line filters may be included between pin 59a and resistor 55 and pin 59b and resistor 57 to prevent any unwanted signal pickup on long wire runs to potentiometer 61 from reaching comparator terminal 45. It is preferable that these line filters have negligible DC resistance in comparison to resistor 55 and resistor 57. A simple inductor and capacitor low pass filter in each line is adequate.

It should also be apparent that external squelch adjustment control could be achieved by connecting variable resistance circuitry, analogous to that around resistors 51 and 53 of divider network 49, to the voltage dividing circuit in the receiver leg establishing the squelch drive signal; i.e., to potentiometer 33. In such instance, a variable resistance circuit would be connected between the high voltage end of potentiometer 33 and the wiper of potentiometer 33; and another variable resistance circuit would be connected between the ground side of potentiometer 33 and the wiper of potentiometer 33.

Moreover, the principles of the present invention may be employed in conjunction with other types of squelch systems. As is shown in the aforementioned U.S. Pat. No. 3,188,571, several different squelch systems are well known in the art and include "Carrier Squelch" wherein the squelch drive signal is derived from the receiver AGC line, and "Coherent Carrier Squelch" wherein the squelch drive signal is derived by sensing, with selective bandpass filtering, the level of IF carrier present at the IF output. For the Carrier Squelch system, a squelch drive signal of proper amplitude, phase, and polarity could be derived from the AGC voltage and compared, substantially as aforedescribed, with a reference signal to generate the gating control. Although amplification, phase change, or polarity change of the AGC voltage may be required due to the specific design of the AGC system, methods of accomplishing same will be apparent to those skilled in the art. For instance, a phase change may be accomplished with inverting amplifiers or by switching the squelch drive signal to the comparator noninverting input and switching the center tap of voltage divider network 49 to the comparator inverting input. A polarity change may be accomplished by re-biasing, as at a summing junction or summing amplifier, the AGC voltage. For the Coherent Carrier Squelch system, a squelch drive signal of proper amplitude, phase, and polarity could be derived, again for comparison with a reference signal to generate gating control, but, instead of from the AGC voltage, from a detected output of a narrow bandpass (at the IF frequency) filter. As already mentioned, phase changes, or polarity changes if needed, may be accomplished by means apparent to those skilled in the art.

A further example of various squelch systems is the "Signal Plus Noise to Noise Squelch" wherein noise above the highest audio frequency is separated from the audio pulse noise below the highest audio and the two outputs are compared after detection and filtering. It should be apparent that, once polarity and phase are taken into account, the signal that results from the comparison of these two outputs could serve as a squelch drive signal to be compared substantially as previously described, with a reference signal to generate the gating control.

Thus, while particular embodiments of the present invention have been shown and/or described, it is apparent that changes and modifications may be made therein without departing from the invention in its broader aspects. The aim of the appended claims, therefore, is to cover all such changes and modifications as fall within the true spirit and scope of the invention.

What is claimed is:

1. A radio receiver having, optionally, preset or adjustable squelch means and comprising: demodulator means; means connected to said demodulator means for processing the intelligence of the demodulator output, and having gating means; and squelch circuit means connected to said demodulator means and said gating means for controlling said gating means, said squelch circuit means comprising means for establishing and comparing a squelch drive signal and a reference signal, and including at least one voltage dividing circuit means for controlling, prior to their comparison, the amplitude of at least one of said signals, said voltage dividing circuit comprising first and second series connected resistive elements; and squelch control adjustment means comprising variable resistance circuit means connectable to said voltage dividing circuit for providing first and second variable resistance electrical paths respectively around said first and second resistive elements whereby, when said variable resistance circuit means is not connected to said voltage divider circuit, said squelch means is fully operative, and said receiver has a preset squelch threshold level, and when said variable resistance circuit means is connected to said voltage divider circuit, said squelch means is fully operative and said receiver has an adjustable squelch threshold level.

2. A receiver as defined in claim 1 wherein said variable resistance circuit means includes a single potentiometer means providing simultaneous, equal, and opposite resistance changes in the two variable resistance electrical paths.

3. A receiver as defined in claim 2 wherein said two variable resistance paths are valued to permit adjustment of signal amplitude within a range extending above and below the signal amplitude normally established when said voltage dividing circuit means and said variable resistance circuit means are not connected.

4. A receiver as defined in claim 3 wherein at least one variable resistance path includes resistance means of fixed value for providing vernier adjustment.

5. A receiver as defined in claim 3 wherein said means for establishing and comparing a squelch drive signal and a reference signal includes separate and distinct means for establishing a squelch drive signal, means for establishing a reference signal, and means for comparing said two signals, and said voltage dividing circuit and said squelch control adjustment means constitute a part of said means for establishing said reference signal.

6. A receiver as defined in claim 5 wherein said means for establishing a reference signal includes hysteresis providing means comprising resistance means connected between the output and an input of said signal comparing means.

7. A receiver as defined in claim 1 wherein said two variable resistance paths are valued to permit adjustment of signal amplitude within a range extending above and below the signal amplitude normally established when said voltage dividing circuit means and said variable resistance circuit means are not connected.

8. A receiver as defined in claim 7 wherein at least one variable resistance path includes resistance means of fixed value for providing vernier adjustment.

9. A receiver as defined in claim 7 wherein said means for establishing and comparing a squelch signal and a reference signal includes separate and distinct means for establishing a squelch drive signal, means for establishing a reference signal, and means for comparing said two signals, and said voltage dividing circuit and said squelch control adjustment means constitute a part of said means for establishing said reference signal.

10. A receiver as defined in claim 9 wherein said means for establishing a reference signal includes hysteresis providing means comprising resistance means connected between the output and an input of said signal comparing means.

11. For use with a receiver having gating means, squelch means comprising:
   squelch circuit means for controlling said gating means, and
   squelch control adjustment means connectable, at user option, to said squelch circuit means,
   said squelch circuit means comprising means for establishing and comparing a squelch drive signal and a reference signal, and including at least one voltage dividing circuit means for controlling, prior to their comparison, the amplitude of a predetermined one of said signals such that said squelch means, when said squelch control adjustment means is not connected, is fully operative and said receiver has a preset squelch threshold level,
   said squelch control adjustment means comprising potentiometer means connectable to said squelch circuit means for providing, when connected, adjustment in the amplitude of said predetermined one of said signals such that said squelch means, when said potentiometer means is connected, is fully operative and said receiver has an adjustable squelch threshold level which may be adjusted with said potentiometer means to, above, and below said preset threshold level.

12. Squelch means as defined in claim 11 wherein said means for establishing and comparing a squelch drive signal and a reference signal includes separate and distinct means for establishing a squelch drive signal, means for establishing a reference signal, and means for comparing said two signals, and said voltage dividing circuit and said squelch control adjustment means constitute a part of said means for establishing said reference signal.

13. Squelch means as defined in claim 12 wherein said means for establishing a reference signal includes hysteresis providing means comprising resistance means connected between the output and an input of said signal comparing means.

* * * * *